(12) United States Patent
Yoshikawa et al.

(10) Patent No.: US 10,181,539 B2
(45) Date of Patent: Jan. 15, 2019

(54) PHOTOELECTRIC CONVERSION ELEMENT AND PHOTOELECTRIC CONVERSION DEVICE INCLUDING THE SAME

(71) Applicants: Sharp Kabushiki Kaisha, Sakai, Osaka (JP); The University of Tokyo, Bunkyo-ku, Tokyo (JP)

(72) Inventors: Hirofumi Yoshikawa, Sakai (JP); Makoto Izumi, Sakai (JP); Yasuhiko Arakawa, Tokyo (JP); Takeo Kageyama, Tokyo (JP)

(73) Assignees: SHARP KABUSHIKI KAISHA, Sakai (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 15/632,523

(22) Filed: Jun. 26, 2017

(65) Prior Publication Data
US 2018/0006174 A1    Jan. 4, 2018

(30) Foreign Application Priority Data
Jun. 27, 2016  (JP) .................................. 2016-126295

(51) Int. Cl.
*H01L 31/06* (2012.01)
*H01L 31/0352* (2006.01)
(Continued)

(52) U.S. Cl.
CPC ................ *H01L 31/035218* (2013.01); *H01L 21/02505* (2013.01); *H01L 31/02327* (2013.01);
(Continued)

(58) Field of Classification Search
CPC ....... H01L 21/02505; H01L 31/035218; H01L 31/022466; H01L 31/02327; H01L 31/06;
(Continued)

(56) References Cited

U.S. PATENT DOCUMENTS

| | | | |
|---|---|---|---|
| 2004/0012063 A1* | 1/2004 | Kawano | G02B 6/12004 257/436 |
| 2007/0151592 A1 | 7/2007 | Forrest et al. | |
| 2011/0023951 A1* | 2/2011 | Ryoo | H01L 31/02248 136/255 |
| 2011/0146755 A1 | 6/2011 | Curran et al. | |

(Continued)

FOREIGN PATENT DOCUMENTS

| | | |
|---|---|---|
| JP | 2010-509772 A | 3/2010 |
| JP | 2010-206074 A | 9/2010 |

(Continued)

OTHER PUBLICATIONS

Marti et al., "Production of Photocurrent due to Intermediate-to-Conduction-Band Transitions: A Demonstration of a Key Operating Principle of the Intermediate-Band Solar Cell", Physical Review Letters, vol. 97, 247701, Dec. 13, 2006, 4 pages.

*Primary Examiner* — Joseph Galvin, III
(74) *Attorney, Agent, or Firm* — Keating & Bennett, LLP

(57) ABSTRACT

A photoelectric conversion element includes a buffer layer, a BSF layer, a base layer, a photoelectric conversion layer, an emitter layer, a window layer, a contact layer, and a p-type electrode sequentially on one surface of a substrate, and includes an n-type electrode on the other surface of the substrate. The photoelectric conversion layer has at least one quantum dot layer. The at least one quantum dot layer includes a quantum dot and a barrier layer. A photoelectric conversion member including the buffer layer, the BSF layer, the base layer, the photoelectric conversion layer, the emitter layer, the window layer, and the contact layer has an edge of incidence that receives light in an oblique direction relative to the growth direction of the quantum dot. A concentrator concentrates sunlight and causes the concentrated sunlight to enter the photoelectric conversion member from the edge of incidence.

7 Claims, 13 Drawing Sheets

(51) Int. Cl.
*H01L 21/02* (2006.01)
*H01L 31/0224* (2006.01)
*H01L 31/0232* (2014.01)
*H01L 31/101* (2006.01)
*H01L 31/0304* (2006.01)
*H01L 31/0735* (2012.01)
*H01L 31/054* (2014.01)

(52) U.S. Cl.
CPC ............. *H01L 31/022466* (2013.01); *H01L 31/03044* (2013.01); *H01L 31/03046* (2013.01); *H01L 31/0547* (2014.12); *H01L 31/06* (2013.01); *H01L 31/0735* (2013.01); *H01L 31/101* (2013.01)

(58) Field of Classification Search
CPC ..... H01L 31/101; G02B 6/12004; G02B 6/42; G02B 6/4295
See application file for complete search history.

(56) References Cited

U.S. PATENT DOCUMENTS

| | | | |
|---|---|---|---|
| 2011/0242376 A1* | 10/2011 | Ando | H01L 27/14623 348/294 |
| 2012/0111398 A1* | 5/2012 | Suto | H01L 31/03521 136/255 |
| 2013/0160818 A1 | 6/2013 | Li et al. | |
| 2013/0209025 A1* | 8/2013 | Levy | G02B 6/4214 385/14 |
| 2014/0076393 A1* | 3/2014 | Chang | H01L 31/02008 136/256 |

FOREIGN PATENT DOCUMENTS

| | | |
|---|---|---|
| JP | 2012-109434 A | 6/2012 |
| JP | 2012-124288 A | 6/2012 |
| JP | 2013-135236 A | 7/2013 |
| JP | 2013-229513 A | 11/2013 |
| JP | 2015-201563 A | 11/2015 |

* cited by examiner

Fig. 11A
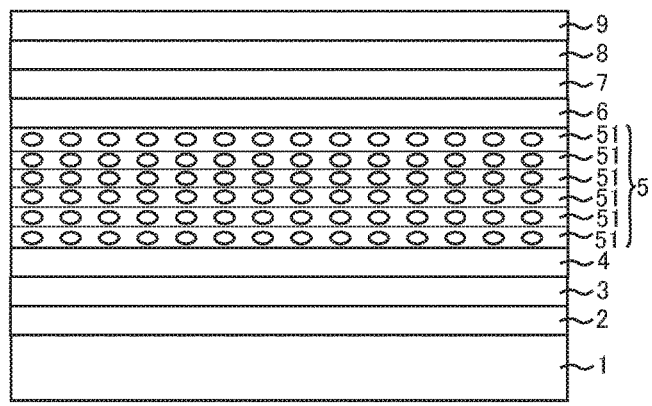
Fig. 11B
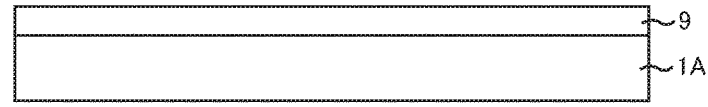
Fig. 11C
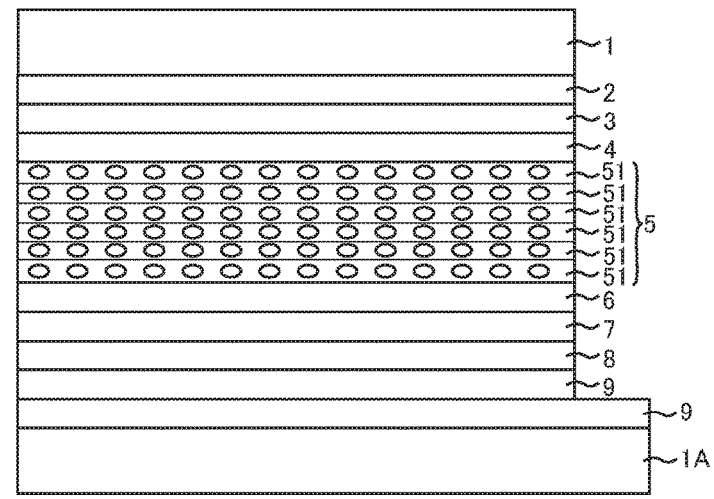
Fig. 11D

PHOTOELECTRIC CONVERSION ELEMENT AND PHOTOELECTRIC CONVERSION DEVICE INCLUDING THE SAME

BACKGROUND

1. Field

The present disclosure relates to a photoelectric conversion element and a photoelectric conversion device including the photoelectric conversion element.

2. Description of the Related Art

Solar cells and photosensors (photodetectors) are example photoelectric conversion elements having a photoelectric conversion layer. Solar cells have been widely researched and developed using light in a broad wavelength range in order to improve photoelectric conversion efficiency. For example, there have been proposed solar cells in which electrons are photoexcited in two steps through a quantum level (including a superlattice miniband and an intermediate band) formed between the valence band and the conduction band of a matrix material, which makes it possible to use light having long wavelengths (Japanese Unexamined Patent Application Publication (Translation of PCT Application) No. 2010-509772; A. Marti', E. Antoli'n, C. R. Stanley, C. D. Farmer, N. Lo'pez, P. Diaz, E. Ca'novas, P. G. Linares, and A. Luque, "Production of Photocurrent due to Intermediate-to-Conduction-Band Transitions: A Demonstration of a Key Operating Principle of the Intermediate-Band Solar Cell," PHYSICAL REVIEW LETTERS, PRL 97, 247701 (2006)).

Such solar cells including quantum dots are compound solar cells including quantum dot layers having quantum dots. When the quantum dots are present in the matrix semiconductor, two-step photoexcitation through a quantum level enables absorption of light in a wavelength region that has not been used to date (absorption of photons of energy less than the bandgap of the matrix material) and thus increases photocurrent.

Quantum dot photosensors having quantum dots have also been researched and developed to improve sensitivity. For example, there has been proposed a quantum dot photosensor that uses intersublevel transition through a quantum level in the conduction band to increase sensitivity in the middle- and far-infrared regions (Japanese Unexamined Patent Application Publication No. 2012-109434).

Current solar cells including quantum dot layers have insufficient photoelectric conversion efficiency. A reason for this may be the low efficiency of two-step light absorption through a quantum level (including a superlattice miniband and an intermediate band). In particular, such solar cells have a problem of low absorption associated with the intersublevel transition (intersubband transition), which is light absorption in the second step of the two-step light absorption process. Quantum dot photosensors also have low absorption associated with the intersublevel transition (intersubband transition) and thus have a low SN ratio. Consequently, anticipated high-sensitivity sensors have not been realized.

The intersublevel transition in quantum structure has polarization dependency. In the case of quantum wells, absorption of only light polarized in the growth direction of the quantum wells occurs. In the case of quantum dots, absorption of both light polarized in the growth direction of the quantum dots and light polarized in the in-plane direction perpendicular to the growth direction of the quantum dots occurs. Since normal quantum dots in the growth direction are small, absorption of light polarized in the growth direction occurs at higher energy than absorption of light polarized in the in-plane direction. In the case of solar cells and sensors using electric current extraction, carriers produced by absorption of light polarized in the growth direction are produced in a quantum level that is high in energy position, and thus the carriers can be extracted with low bias. However, light polarized in the growth direction is not efficiently obtained by incidence of light on the device in the growth direction. There is a need to deliver light at an oblique angle relative to the device or to introduce, for example, a textured structure or a diffraction grating into the device.

To improve the absorption, techniques for increasing the number of quantum dot layers are being actively developed. However, increasing the number of quantum dot layers is not practical because it imposes restrictions on materials such as small critical thickness and on crystal growth from the viewpoint of lattice mismatch and also increases crystal growth time. In the research step, a quantum dot structure having 300 layers has been reported.

SUMMARY

According to an embodiment of the present disclosure, a photoelectric conversion element includes a substrate, a photoelectric conversion layer, a concentrator, a first electrode, and a second electrode. The photoelectric conversion layer is disposed on the substrate and has at least one quantum layer. The first electrode is disposed at one side of the photoelectric conversion layer in the thickness direction. The second electrode is disposed at the other side of the photoelectric conversion layer in the thickness direction. The photoelectric conversion layer has an edge of incidence at one end of the photoelectric conversion layer in the direction perpendicular to the thickness direction of the photoelectric conversion layer. The edge of incidence guides light from the concentrator to the photoelectric conversion layer in an oblique direction relative to the thickness direction of the photoelectric conversion layer.

According to an embodiment of the present disclosure, a photoelectric conversion device includes plural photoelectric conversion elements. The photoelectric conversion elements are electrically coupled in series or in parallel. Each of the photoelectric conversion elements corresponds to the photoelectric conversion element according to the embodiment.

BRIEF DESCRIPTION OF THE DRAWINGS

FIGS. 11A to 11D are views illustrating a first process of a method for fabricating the photoelectric conversion element shown in FIG. 10;

DESCRIPTION OF THE EMBODIMENTS

Figure 1:
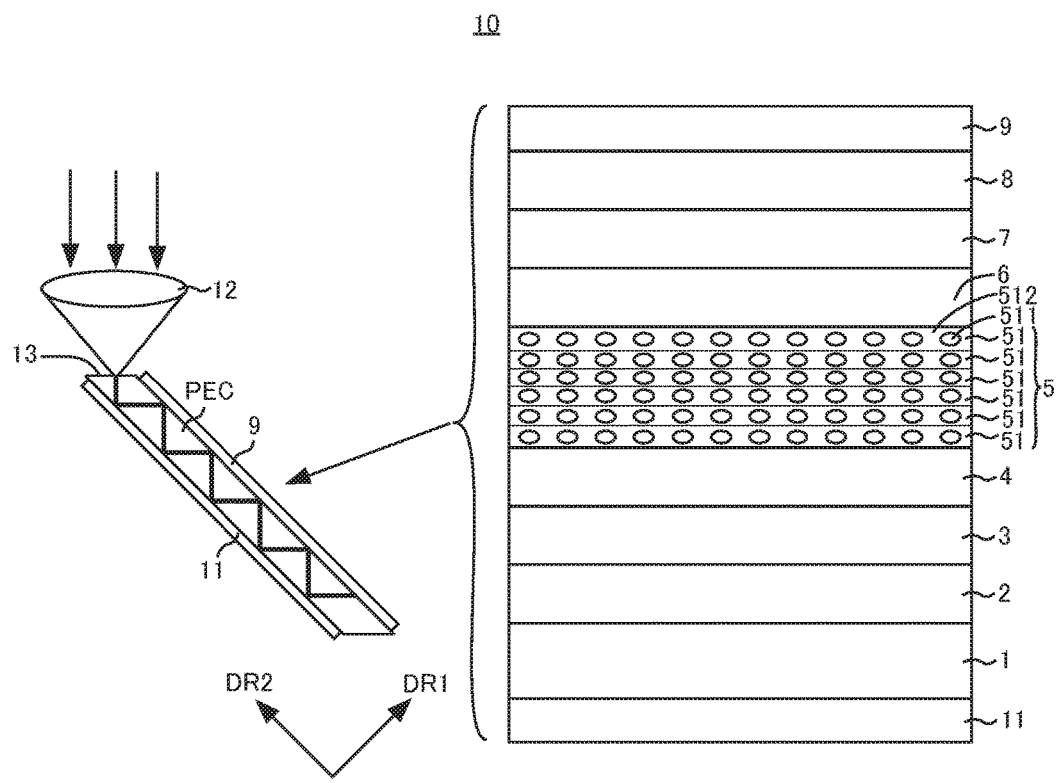
FIG. 1 is a schematic view illustrating the structure of a photoelectric conversion element according to a first embodiment of the present disclosure.

Embodiments of the present disclosure will be described in detail with reference to the drawings. The same parts or corresponding parts in the drawings are denoted by the same reference characters, and the description thereof is not repeated. For easy understanding, the structure is simplified or schematically illustrated or some of the components are omitted in the drawings referred to below. In addition, the dimensional ratio between the components shown in the drawings is not necessarily an actual dimensional ratio.

The terms used herein are briefly described here. These terms are, however, described for the structures in the embodiments of the present disclosure, and the present disclosure is not limited by the description of the terms.

The term "quantum layer" refers to, for example, a quantum dot layer, a quantum nanowire layer, or a quantum well layer and has a discrete energy level because of the quantum effect. In the embodiments of the present disclosure, a quantum dot, a quantum nanowire, a quantum well, a capping layer, and a barrier layer are collectively called a "quantum layer".

The term "quantum dot" refers to a semiconductor fine particle that has a particle size of 100 nm or less and is covered with a semiconductor material having a larger bandgap than a semiconductor material constituting the quantum dot.

The term "barrier layer" refers to a layer that constitutes a quantum layer and is composed of a matrix semiconductor material having a larger bandgap than a semiconductor material constituting a quantum dot, a quantum nanowire, or a quantum well.

The term "quantum level" refers to a discrete energy level.

The term "intersublevel (intersubband) transition" refers to transition from a quantum level in the conduction band to another quantum level in the conduction band which is higher than the original energy position or to the conduction band of a matrix material (including a level that is higher in energy position than the conduction band lower edge of the matrix material and is affected by the quantum confinement effect).

First Embodiment

FIG. 1 is a schematic view illustrating the structure of a photoelectric conversion element according to a first embodiment of the present disclosure. Referring to FIG. 1, a photoelectric conversion element 10 according to the first embodiment of the present disclosure includes a substrate 1, a buffer layer 2, a back surface field (BSF) layer 3, a base layer 4, a photoelectric conversion layer 5, an emitter layer 6, a window layer 7, a contact layer 8, a p-type electrode 9, an n-type electrode 11, and a concentrator 12.

The buffer layer 2 is disposed on the substrate 1 so as to contact one surface of the substrate 1.

The BSF layer 3 is disposed on the buffer layer 2 so as to contact the buffer layer 2.

The base layer 4 is disposed on the BSF layer 3 so as to contact the BSF layer 3.

The photoelectric conversion layer 5 is disposed on the base layer 4 so as to contact the base layer 4.

The emitter layer 6 is disposed on the photoelectric conversion layer 5 so as to contact the photoelectric conversion layer 5.

The window layer 7 is disposed on the emitter layer 6 so as to contact the emitter layer 6.

The contact layer 8 is disposed on the window layer 7 so as to contact the window layer 7.

The p-type electrode 9 is disposed on the contact layer 8 so as to contact the contact layer 8.

The n-type electrode 11 is disposed on the substrate 1 so as to contact the other surface of the substrate 1.

The concentrator 12 is disposed adjacent to a photoelectric conversion member PEC including the substrate 1, the buffer layer 2, the BSF layer 3, the base layer 4, the photoelectric conversion layer 5, the emitter layer 6, the window layer 7, and the contact layer 8.

The photoelectric conversion layer 5 includes plural quantum dot layers 51 and has a structure in which the quantum dot layers 51 are stacked in the normal direction of the substrate 1. The quantum dot layers 51 each include quantum dots 511 and a barrier layer 512. The quantum dots 511 are surrounded by the barrier layer 512.

The substrate 1 is formed of, for example, a semiconductor containing an n-type impurity. More specifically, the substrate 1 is formed of, for example, n-GaAs.

The buffer layer 2 is formed of, for example, $n^+$-GaAs. The buffer layer 2 has a thickness of, for example, 100 nm to 500 nm.

The BSF layer 3 is formed of, for example, $n$-$Al_{0.8}Ga_{0.2}As$. The BSF layer 3 has a thickness of, for example, 10 nm to 300 nm.

The base layer 4 is formed of a semiconductor containing an n-type impurity. More specifically, the base layer 4 is formed of, for example, n-GaAs, n-AlGaAs, n-InGaP, n-GaAsP, n-AlGaAsSb, n-AlAsSb, n-GaAsSb, n-InAlAs, or n-ZnTe.

The base layer 4 may be formed by adding an n-type impurity to the same semiconductor material as that of the barrier layer 51 or adding an n-type impurity to a semiconductor material different from that of the barrier layer 51. The concentration of the n-type impurity in the base layer 4 is not limited and may be appropriately set according to the semiconductor material constituting the base layer.

The base layer 4 may be a thin film formed by, for example, a chemical vapor deposition (CVD) method or a molecular beam epitaxy (MBE) method.

The base layer 4 has a thickness of, for example, 20 nm to 3000 nm.

The photoelectric conversion layer 5 is doped with an impurity. Doping with an impurity enables effective occurrence of the intersubband transition.

The quantum layers (quantum dot layers 51) of the photoelectric conversion layer 5 may include an insertion layer, such as a quantum well, together with the quantum dots, a capping layer, and the barrier layer 512.

The material of the quantum layers (quantum dot layers 51) is not limited and may be a group III-V semiconductor.

The quantum dots 511 may be formed of a semiconductor material having a bandgap energy less than that of the barrier layer 512. The quantum dots 511 and the barrier layer 512 may each be formed of, for example, any one of $GaAs_xSb_{1-x}$, AlSb, $InAs_xSb_{1-x}$, $Ga_xIn_{1-x}Sb$, $AlSb_xAs_{1-x}$, $AlAs_zSb_{1-z}$, $In_xGa_{1-x}As$, $Al_xGa_{1-x}As$, $Al_yGa_{1-y}As_zSb_{1-z}$, $(Al_yGa_{1-y})_zIn_{1-z}P$, $GaAs_xP_{1-x}$, $Ga_yIn_{1-y}As_zP_{1-z}$, and $In_xAl_{1-x}As$ or may be formed of a mixed crystal material thereof. In the materials mentioned above, x, y, and z have the relationships of $0 \leq x \leq 1$, $0 \leq y \leq 1$, and $0 \leq z \leq 1$, respectively.

The quantum dots 511 and the barrier layer 512 may each be formed of a group IV semiconductor, a compound semiconductor containing a group III semiconductor material and a group V semiconductor material, or a compound semiconductor containing a group II semiconductor material and a group VI semiconductor material or may each be formed of a mixed crystal material thereof. These groups are listed in the periodic table.

The quantum dots 511 and the barrier layer 512 may each be formed of a chalcopyrite-based material or may be formed of a semiconductor other than the chalcopyrite-based material.

Examples of combinations of materials of the quantum dots 511/the barrier layer 512 include $In_xGa_{1-x}As/Al_xGa_{1-x}As$, $In_xGa_{1-x}As/In_xGa_{1-x}P$, $In_xGa_{1-x}As/Ga_yIn_{1-y}As_zP_{1-z}$, $In_xGa_{1-x}As/Al_yGa_{1-y}As_zSb_{1-z}$, $In_xGa_{1-x}As/AlAs_zSb_{1-z}$, $In_xGa_{1-x}As/Al_xGa_{1-x}Sb$, $InAs_xSb_{1-x}/Al_yGa_{1-y}As_zSb_{1-z}$, $InAs_xSb_{1-x}/AlAs_zSb_{1-z}$, $InAs_xSb_{1-x}/Al_xGa_{1-x}Sb$, $InP/In_xAl_{1-x}As$, $In_xGa_{1-x}As/In_xAl_{1-x}As$, $In_xGa_{1-x}As/GaAs_xP_{1-x}$, $In_xGa_{1-x}As/(Al_yGa_{1-y})_zIn_{1-z}P$, $InAs_xSb_{1-x}/In_xGa_{1-x}P$, $InAs_xSb_{1-x}/GaAs_xP_{1-x}$, and $Ga_xIn_{1-x}Sb/AlSb$. In all of the materials mentioned above, x, y, and z have the relationships of $0 \leq x \leq 1$, $0 \leq y \leq 1$, and $0 \leq z \leq 1$, respectively.

The quantum dot layers 51 (quantum layers) including the quantum dots 511 and the barrier layer 512 may contain at least one of Al and P. This is because the presence of at least one of Al and P in the quantum layers (quantum dot layers 51) can efficiently improve photoelectric conversion.

The photoelectric conversion layer 5 may be an i-type semiconductor layer or, when electromotive force is generated by receiving light, may be a semiconductor layer containing a p-type impurity or an n-type impurity.

The emitter layer 6 is a semiconductor layer containing a p-type impurity. More specifically, the emitter layer 6 is formed of, for example, p-GaAs, p-AlGaAs, p-InGaP, p-GaAsP, p-AlGaAsSb, p-AlAsSb, p-GaAsSb, p-InAlAs, or p-ZnTe.

The emitter layer 6 may be formed by adding a p-type impurity to the same semiconductor material as that of the barrier layer 512 or adding a p-type impurity to a semiconductor material different from that of the barrier layer 512. The concentration of the p-type impurity in the emitter layer 6 is not limited and may be appropriately set according to the semiconductor material constituting the emitter layer 6.

The emitter layer 6 may be a thin film formed by, for example, a CVD method or an MBE method.

The emitter layer 6 has a thickness of, for example, 20 nm to 3000 nm.

The emitter layer 6 together with the base layer 4 and the photoelectric conversion layer 5 forms a pin junction or pn junction (pn⁻n junction, pp⁻n junction, pp⁺nn junction, or pnn⁺ junction). Receiving light by the structure of the pin junction or pn junction generates electromotive force. In other words, the base layer 4, the photoelectric conversion layer 5, and the emitter layer 6 convert the energy of incident light into electric energy.

The window layer 7 is a semiconductor layer containing a p-type impurity. More specifically, the window layer 7 is formed of, for example, $p-Al_{0.8}Ga_{0.2}As$. The window layer 7 has a thickness of, for example, 10 nm to 300 nm.

The contact layer 8 is formed of a semiconductor layer containing a p-type impurity. More specifically, the contact layer 8 is formed of, for example, $p^+$-GaAs. The contact layer 8 has a thickness of, for example, 10 nm to 300 nm.

The p-type electrode 9 may be formed of a combined material, such as Ti/Pt/Au, Au/Zn, Au/Cr, Ti/Au, or Au/Zn/Au. The p-type electrode 9 has a thickness of, for example, 10 nm to 500 nm.

The n-type electrode 11 may be formed of a combined material, such as Au/AuGeNi, AuGe/Ni/Au, Au/Ge, Au/Ge/Ni/Au. The n-type electrode 11 has a thickness of, for example, 10 nm to 500 nm.

The concentrator 12 concentrates sunlight and causes the concentrated sunlight to enter the photoelectric conversion layer 5 of the photoelectric conversion member PEC from the edge 13 of the photoelectric conversion member PEC.

When the growth direction of the quantum dots 511 is defined as DR1, the edge 13 and the direction DR1 form, for example, an angle of 45 degrees. The concentrator 12 causes the concentrated sunlight to enter the photoelectric conversion layer 5 in the direction perpendicular to the edge 13. As a result, the sunlight enters the photoelectric conversion layer 5 at an oblique angle relative to the growth direction DR1 of the quantum dots 511. Therefore, the photoelectric conversion layer 5 has an edge of incidence (edge 13) that guides sunlight to the photoelectric conversion layer 5 at an oblique angle relative to the growth direction DR1 of the quantum dots 511. The edge of incidence is disposed at one end of the photoelectric conversion layer 5 in the in-plane direction DR2 of the photoelectric conversion member PEC perpendicular to the growth direction DR1 of the quantum dots 511.

The angle at which sunlight enters the photoelectric conversion layer 5 may be a certain angle relative to the growth direction DR1 of the quantum dots 511. The lager the angle relative to the growth direction DR1 of the quantum dots 511 is, the further the polarized components are oriented in the growth direction DR1. The angle θ relative to the growth direction DR1 at which the sunlight enters the photoelectric conversion layer 5 is in the range of 0 degrees<θ<90 degrees. The angle θ may be as large as possible in a range less than 90 degrees.

The light that has entered the photoelectric conversion member PEC is reflected plural times by the p-type electrode 9 and the n-type electrode 11 and travels inside the photoelectric conversion member PEC in the in-plane direction DR2 of the photoelectric conversion member PEC.

As a result, absorption of light polarized in the growth direction DR1 of the quantum dots 511 and light polarized in the in-plane direction DR2 perpendicular to the growth direction DR1 of the quantum dots 511 occurs, which increases photocurrent. Therefore, the photoelectric conversion by the photoelectric conversion element 10 can be improved.

FIGS. 2A to 4C are views illustrating first to third processes of a method for fabricating the photoelectric conversion element 10 shown in FIG. 1.

Figure 2A:
FIGS. 2A to 2E are views illustrating a first process of a method for fabricating the photoelectric conversion element shown in FIG. 1.

Referring to FIGS. 2A to 2E, a substrate 1 formed of n-GaAs is provided (see step (a) in FIG. 2A) when the fabrication of the photoelectric conversion element 10 is started. The substrate 1 is placed in a molecular beam epitaxy (MBE) device.

Figure 2B:
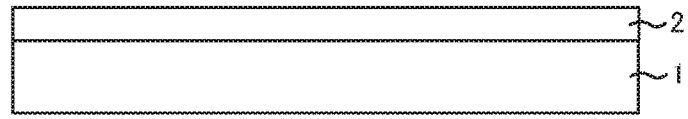

A buffer layer 2 is then formed on the substrate 1 by using an MBE method (see step (b) in FIG. 2B). The buffer layer 2 is formed of, for example, n+-GaAs, and the buffer layer 2 has a thickness of, for example, 300 nm. Forming the buffer layer 2 can improve the crystallinity of a photoelectric conversion layer 5 to be formed on the buffer layer 2. As a result, a solar cell in which the photoelectric conversion layer 5 has high light receiving efficiency can be provided.

Figure 2C:

After step (b) in FIG. 2B, a BSF layer 3 is formed on the buffer layer 2 by using an MBE method (see step (c) in FIG. 2C). The BSF layer 3 is formed of, for example, n-$Al_{0.8}Ga_{0.2}As$, and the BSF layer 3 has a thickness of, for example, 50 nm.

Figure 2D:
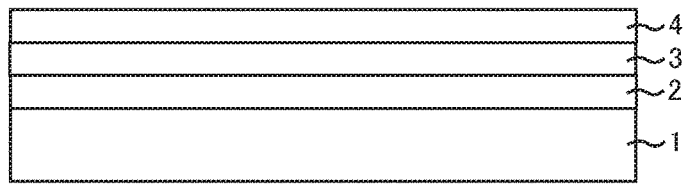

Next, a base layer 4 is formed on the BSF layer 3 by using an MBE method (see step (d) in FIG. 2D). The base layer 4 is formed of, for example, n-GaAs, and the base layer 4 has a thickness of, for example, 2000 nm.

Subsequently, quantum dot layers 51 each including quantum dots 511 and a barrier layer 512 are stacked to form a photoelectric conversion layer 5 on the base layer 4 (see step (e) in FIG. 2E). The photoelectric conversion layer 5 is formed by a Stranski-Krastanov (S-K) growth method. More specifically, for example, a GaAs layer is crystal-grown as the barrier layer 512, and then the quantum dots 511 formed of indium arsenide (InAs) is formed by a self-assembly mechanism. Subsequently, a GaAs layer serving as the barrier layer 512 is crystal-grown on the quantum dots 511. The quantum dot layer 51 is formed accordingly. The crystal growth of the quantum dot layers 51 is repeated so that the quantum dot layers 51 are stacked. The photoelectric conversion layer 5 is formed accordingly.

Figure 2E:
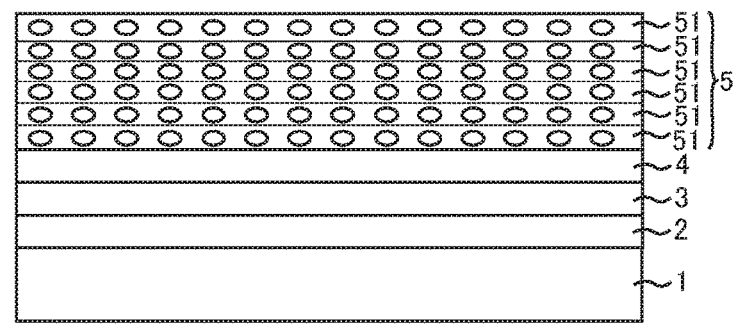
Figure 3A:
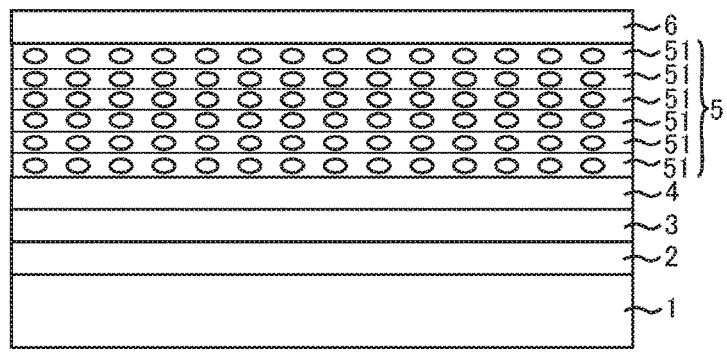
FIGS. 3A to 3C are views illustrating a second process of the method for fabricating the photoelectric conversion element shown in FIG. 1.
Figure 3B:
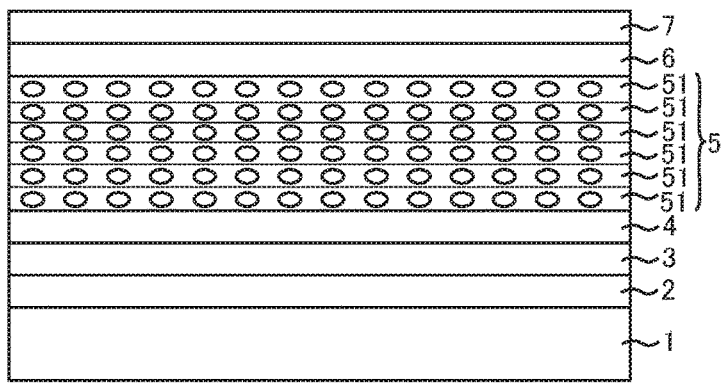
Figure 3C:
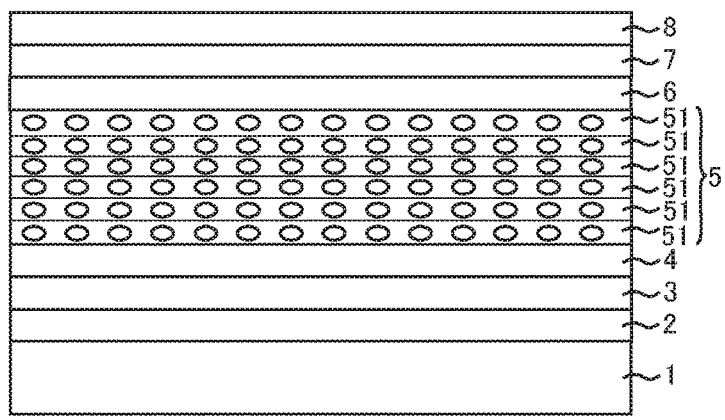

Referring to FIGS. 3A to 3C, after step (e) in FIG. 2E, an emitter layer 6 is formed on the photoelectric conversion layer 5 by using an MBE method (see step (f) in FIG. 3A). The emitter layer 6 is formed of, for example, p-GaAs, and the emitter layer 6 has a thickness of, for example, 250 nm.

A pin structure is formed by forming the emitter layer 6.

After step (f) in FIG. 3A, a window layer 7 is formed on the emitter layer 6 by using an MBE method (see step (g) in FIG. 3B). The window layer 7 is formed of, for example, p-GaAs, and the window layer 7 has a thickness of, for example, 50 nm.

A contact layer 8 is then formed on the window layer 7 by using an MBE method (see step (h) in FIG. 3C). The contact layer 8 is formed of, for example, pt-GaAs, and the contact layer 8 has a thickness of, for example, 50 nm.

Figure 4A:
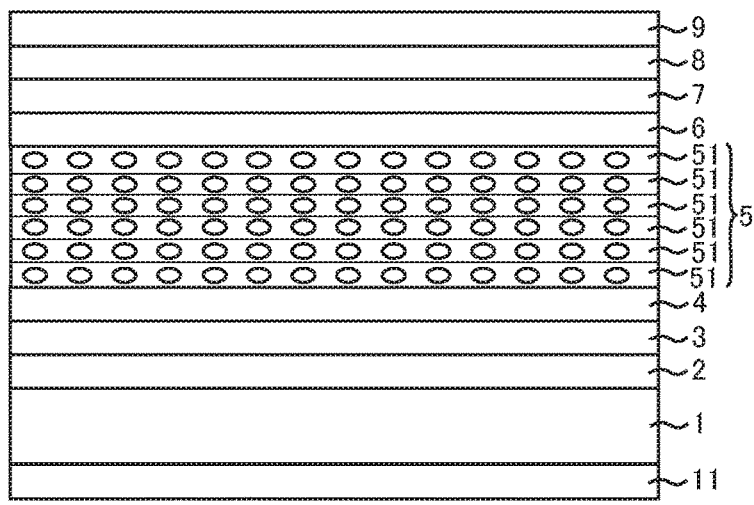
FIGS. 4A to 4C are views illustrating a third process of the method for fabricating the photoelectric conversion element shown in FIG. 1.
Figure 4B:
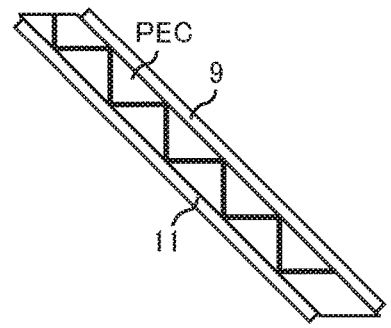
Figure 4C:
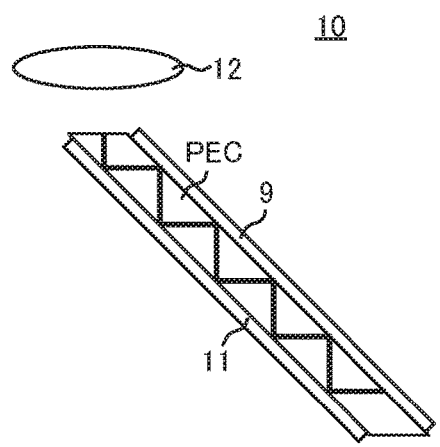

Referring to FIGS. 4A to 4C, the stacked body is taken out of the MBE device after step (h) in FIG. 3C. A p-type electrode 9 is formed on the contact layer 8, and an n-type electrode 11 is formed on the other surface of the substrate 1 (see step (i) in FIG. 4A). The p-type electrode 9 and the n-type electrode 11 may contain Au. The p-type electrode 9 and the n-type electrode 11 are formed by, for example, vapor deposition using resistance heating.

After step (i) in FIG. 4A, for example, an edge of the photoelectric conversion member PEC is polished so as to have an angle of 45 degrees relative to the normal direction of the substrate 1 (see step (j) in FIG. 4B). A concentrator 12 is then placed adjacent to the photoelectric conversion member PEC (see step (k) in FIG. 4C). The photoelectric conversion element 10 is obtained accordingly.

In the fabrication method described above, for example, silicon (Si) can be used as an n-type dopant and, for example, beryllium (Be) can be used as a p-type dopant.

Absorption Experiment

An absorption experiment was carried out to investigate the basic physical properties in the embodiments of the present disclosure and is described below.

Twenty quantum dot layers 51 were formed on a substrate composed of GaAs using an MBE device. InAs was used for quantum dots, and GaAs was used for a capping layer and a barrier layer.

To measure intersublevel absorption, the quantum dots were directly doped with Si. The doping density was twice the in-plane density of the quantum dots. In the measurement of the absorption at room temperature, light from a Globar lamp entered the substrate edge that had been polished to have an angle of 45 degrees. The transmitted light that had been reflected multiple times inside was detected by a detector composed of HgCdTe.

As a result, an intersublevel absorption peak was found at about 0.2 eV in the transmission spectrum. The absorption was about 10%. This absorption peak was observed only in the growth direction of the quantum dots 511. The optical path length calculated on the basis of the length of the photoelectric conversion element was about 17 times the thickness of the photoelectric conversion element.

When light enters the photoelectric conversion element at right angles (in the growth direction of the quantum dots 511), the absorption is found to be 0.6%.

To obtain an absorption of 80%, thousands of the quantum dot layers 51 need to be stacked for normal incidence of light (incidence of light in the growth direction of the quantum dots 511).

With this experimental structure, stacking hundreds of the quantum dot layers 51 can provide an absorption of 80%. As the length of the photoelectric conversion element (the length in the in-plane direction of the quantum dot layers 51) is increased, the number of the stacked quantum dot layers 51 can be reduced, which makes it technically easy to fabricate the photoelectric conversion element 10 and leads to a short fabrication time (low cost).

In this experiment, the substrate edge is polished so as to have an angle of 45 degrees. The angle may be another angle and is normally in the range of larger than 0 degrees to smaller than 90 degrees. Furthermore, when a mechanism (mirror) that reflects light into the photoelectric conversion element 10 is disposed on an edge opposite to the edge of incidence, light passes through the photoelectric conversion layer 5 a greater number of times, and thus the length of the photoelectric conversion element 10 can be shortened.

When the photoelectric conversion layer described above is used in a solar cell (normal vertical incidence), the photocurrent is 0.2 $mA/cm^2$ for AM0 and 0.1 $mA/cm^2$ for AM1.5G on the assumption that sunlight of 0.65 eV or less is absorbed at the above-mentioned absorption.

In the embodiment of the present disclosure, the photocurrent is 3.9 $mA/cm^2$ for AM0 and 1.7 $mA/cm^2$ for AM1.5G on the basis of calculation at the above-mentioned absorption. Therefore, the photoelectric conversion efficiency can be improved. The data of the sunlight spectrum of AM1.5G equal to or higher than 0.31 eV are used.

The embodiment of the present disclosure barely exhibit advantageous effects if the photoelectric conversion layer in the photoelectric conversion element has no quantum layer and is composed of bulk material. This is because the absorption coefficient is large (e.g., $1 \times 10^4$ to $1 \times 10^5$ $cm^{-1}$) in the case of bulk material and light can be sufficiently absorbed by the bulk material even in ordinary vertical incidence. If a photoelectric conversion element in which the photoelectric conversion layer is composed of bulk material is used in the embodiments of the present disclosure, carriers are produced only near the edge of incidence.

Evaluation Experiment

A simulation was performed for a light-receiving element in an embodiment of the present disclosure.

The light absorption spectrum for the quantum structure was simulated by using an 8-band k·p Hamiltonian planewave expansion method in consideration of the influences of strain and the piezoelectric field effect. The optical absorption coefficient α can be estimated by solving formula (1) below.

$$\alpha(\omega) = \frac{e^2}{2n_r c_0 \varepsilon_0 m_0^2 \omega L_x L_y} \int dK_z \sum_{a,b} |e \cdot p_{a,b}|^2 (f_a - f_b) G \quad (1)$$

In formula (1), |M| represents a transition matrix element, a and b each represent a subband number, $n_r$ represents a refractive index, $c_0$ represents the speed of light, $\varepsilon_0$ represents a vacuum dielectric constant, $m_0$ represents an electron mass, $L_x$ and $L_y$ each represent a unit cell size in an in-plane direction (e.g., x direction ((100) direction) or y direction ((010) direction)), $K_z$ represents a superlattice wave number, $f_i$ (i=a, b) represents a distribution function, G represents Gaussian broadening due to variations in size and variations in composition, and ω represents an optical frequency.

For light absorption, a z-polarized wave (001) in the growth direction of the quantum dots 511 was calculated. The intersublevel light absorption (intersubband light absorption) was calculated on the assumption that the ground level in the conduction band (or superlattice miniband) is full of carriers and the first excitation level or higher levels in the conduction band are devoid (vacant) of carriers (($f_a$-fb)=1 in formula (1)).

In the quantum layer, indium gallium phosphide ($In_{0.48}Ga_{0.52}P$) was used as a matrix semiconductor material constituting the barrier layer, and indium arsenide (InAs) was used as a quantum dot material. Although the quantum dot material was InAs in Experimental Example, the quantum dot material may be a mixed crystal material, such as InGaAs, or may be a semiconductor material different from InAs.

In the quantum layer, the quantum dots had a lens shape including a wetting layer of 0.5 nm, the diameter size of the quantum dots in the in-plane direction was 20 nm, and the size (height) of the quantum dots in the stacking direction was 2 nm. The distance between the quantum dots in the in-plane direction was 20 nm, and the distance between the quantum dots in the stacking direction was 4 nm.

Figure 5:
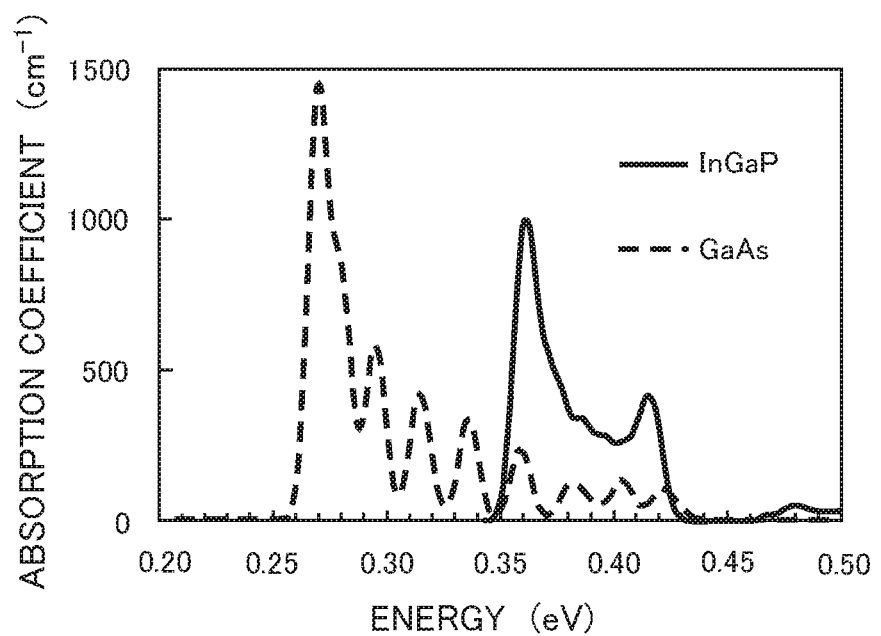
FIG. 5 is a graph illustrating the relationship between the absorption coefficient and energy.

FIG. 5 is a graph illustrating the relationship between the absorption coefficient and energy. In FIG. 5, the vertical axis represents the absorption coefficient, and the horizontal axis represents energy. The solid line indicates the relationship between the absorption coefficient and energy when InGaP is used for the barrier layer. The dashed line indicates the relationship between the absorption coefficient and energy when GaAs is used for the barrier layer.

Referring to FIG. 5, the light absorption spectrum of the quantum layer in which indium gallium phosphide (InGaP) is used as the matrix semiconductor material constituting the barrier layer is found to have a lower absorption-coefficient peak value than that of the quantum layer in which gallium arsenide (GaAs) is used as the matrix semiconductor material constituting the barrier layer. To obtain similar absorption, more quantum layers in which indium gallium phosphide (InGaP) is used as the matrix semiconductor material constituting the barrier layer need to be stacked than quantum layers in which gallium arsenide (GaAs) is used as the matrix semiconductor material constituting the barrier layer. In other words, absorption of light polarized in the growth direction DR1 of the quantum dots 511 can be increased, and as a result, the advantageous effects of the embodiment of the present disclosure are exerted to a greater extent.

When indium gallium phosphide (InGaP) is used as the matrix semiconductor material constituting the barrier layer, the absorption region exists in an energy range from 0.35 to 0.42 eV. The absorption coefficient in this energy range is larger than that in the case where gallium arsenide (GaAs) is used as the matrix semiconductor material constituting the barrier layer. The absorption region (0.35 to 0.42 eV) in the case where indium gallium phosphide (InGaP) is used as the matrix semiconductor material constituting the barrier layer exists on the higher energy side than the absorption region in the case where gallium arsenide (GaAs) is used as the matrix semiconductor material constituting the barrier layer. In consideration of the sunlight spectrum, photocurrent can be increased by using indium gallium phosphide (InGaP) as the matrix semiconductor material constituting the barrier layer.

As described above, light absorption by the photoelectric conversion layer 5 can be increased by delivering light to the photoelectric conversion layer 5 in an oblique direction relative to the growth direction of the quantum dots 511, which can increase the photoelectric conversion of the photoelectric conversion element 10.

As described above, the angle between the edge opposite to the edge 13 of incidence and the growth direction DR1 of the quantum dots 511 is the same as the angle between the edge 13 of incidence and the growth direction DR1 of the quantum dots 511. However, these angles are not necessarily the same in the first embodiment. The angle between the edge opposite to the edge 13 of incidence and the growth direction DR1 of the quantum dots 511 may be different from the angle between the edge 13 of incidence and the growth direction DR1 of the quantum dots 511. The edge opposite to the edge 13 of incidence is not necessarily polished.

Although the photoelectric conversion layer 5 has six quantum layers (quantum dot layers 51) in the above description, the photoelectric conversion layer 5 is not limited to this structure and has at least one quantum layer (quantum dot layer 51) in the first embodiment. As long as the photoelectric conversion layer 5 has at least one quantum layer (quantum dot layer 51), the light polarized in the growth direction DR1 of the quantum dots 511 can be absorbed efficiently, which can improve photoelectric conversion efficiency.

Second Embodiment

Figure 6:
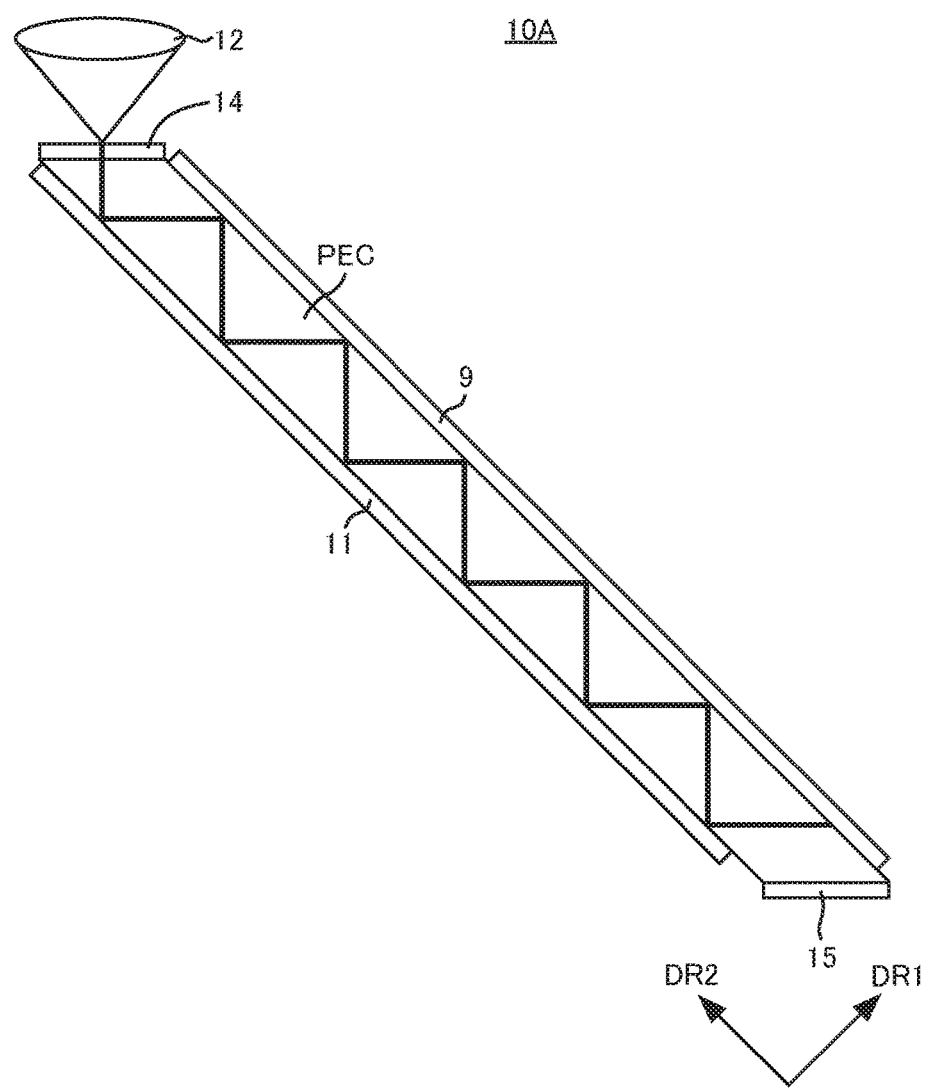
FIG. 6 is a schematic view illustrating the structure of a photoelectric conversion element according to a second embodiment.

FIG. 6 is a schematic view illustrating the structure of a photoelectric conversion element according to a second embodiment. Referring to FIG. 6, a photoelectric conversion element 10A in the second embodiment has the same structure as the photoelectric conversion element 10 illustrated in FIG. 1 except that the photoelectric conversion element 10A further includes an antireflection film 14 and a metal layer 15.

The antireflection film 14 is disposed on the edge of incidence of a photoelectric conversion member PEC. The antireflection film 14 is formed of, for example, $MgF_2$ and ZnS. For example, $MgF_2$ has a thickness of 100 nm, and ZnS has a thickness of 50 nm.

The metal layer 15 is disposed on an edge of the photoelectric conversion member PEC opposite to the edge of incidence in the in-plane direction DR2. The metal layer 15 is formed of, for example, Ag, Au, Au and Cr, or Au and AuGeNe and has a thickness of, for example, 150 nm.

The photoelectric conversion element 10A is fabricated by the fabrication method further including, between step (j) and step (k) in step (a) to step (k) illustrated in FIGS. 2A to 4C, a step of forming the antireflection film 14 on the edge of incidence of the photoelectric conversion member PEC, and a step of forming the metal layer 15 on the other surface opposite to the edge of incidence.

In the photoelectric conversion element 10A, the reflection loss when light from the concentrator 12 enters the photoelectric conversion member PEC can be reduced, and the transmission loss on the edge opposite to the edge of incidence can be reduced. As a result, the amount of light absorbed by the photoelectric conversion layer 5 increases, and the photoelectric conversion element 10A has higher photoelectric conversion efficiency than the photoelectric conversion element 10.

In the photoelectric conversion element 10A, a metal layer may be disposed on each edge in the direction perpendicular to the plane of paper of FIG. 6. This can further reduce the light transmission loss on the edges other than the edge of incidence and can further improve the photoelectric conversion efficiency of the photoelectric conversion element 10A.

Other description of the second embodiment is the same as the description of the first embodiment.

Third Embodiment

Figure 7:
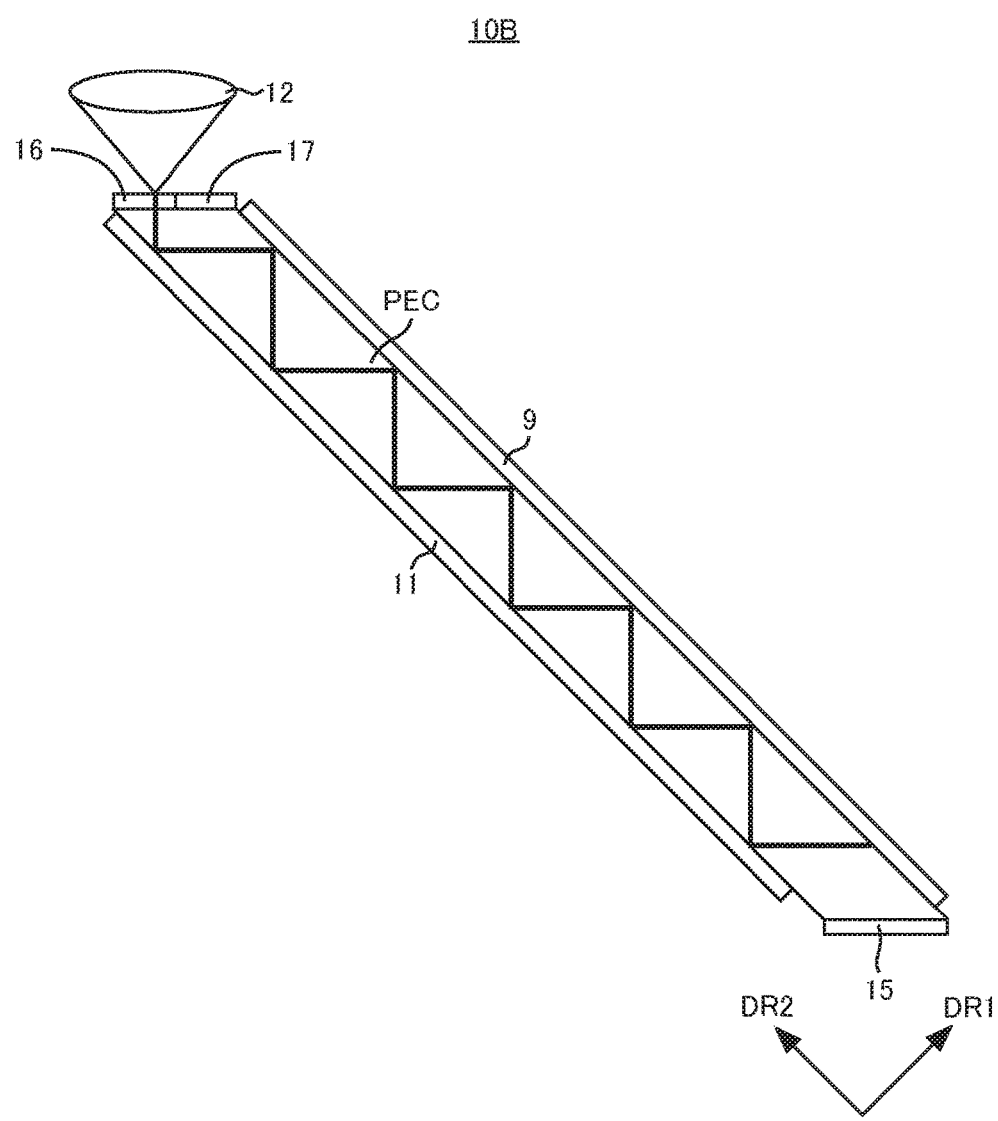
FIG. 7 is a schematic view illustrating the structure of a photoelectric conversion element according to a third embodiment.

FIG. 7 is a schematic view illustrating the structure of a photoelectric conversion element according to a third embodiment. Referring to FIG. 7, a photoelectric conversion element 10B in the third embodiment has an antireflection film 16 and a metal layer 17 instead of the antireflection film 14 of the photoelectric conversion element 10A illustrated in FIG. 6 but otherwise has the same structure as the photoelectric conversion element 10A.

The antireflection film 16 is disposed on the edge of incidence of a photoelectric conversion member PEC. The antireflection film 16 is formed of the same material as the antireflection film 14 and has the same thickness as the antireflection film 14.

The metal layer 17 is disposed on the edge of incidence of the photoelectric conversion member PEC so as to adjoin the antireflection film 16. The metal layer 17 is formed of the same material as the metal layer 15 and has the same thickness as the metal layer 15.

The photoelectric conversion element 10B is fabricated by the fabrication method further including, between step (j) and step (k) in step (a) to step (k) illustrated in FIGS. 2A to 4C, a step of forming the antireflection film 16 and the metal layer 17 on the edge of incidence of the photoelectric conversion member PEC, and a step of forming the metal layer 15 on the other surface opposite to the edge of incidence.

In the photoelectric conversion element 10B, the reflection loss when light from the concentrator 12 enters the photoelectric conversion member PEC can be reduced, the transmission loss on the edge opposite to the edge of incidence can be reduced, and furthermore the transmission loss on the edge of incidence can be reduced. As a result, the amount of light absorbed by the photoelectric conversion layer 5 increases, and the photoelectric conversion element 10B has higher photoelectric conversion efficiency than the photoelectric conversion elements 10 and 10A.

In the photoelectric conversion element 10B, a metal layer may be disposed on each edge in the direction perpendicular to the plane of paper of FIG. 7. This can further reduce the light transmission loss on the edges other than the edge of incidence and can further improve the photoelectric conversion efficiency of the photoelectric conversion element 10B.

Other description of the third embodiment is the same as the description of the first and second embodiments.

Fourth Embodiment

Figure 8:
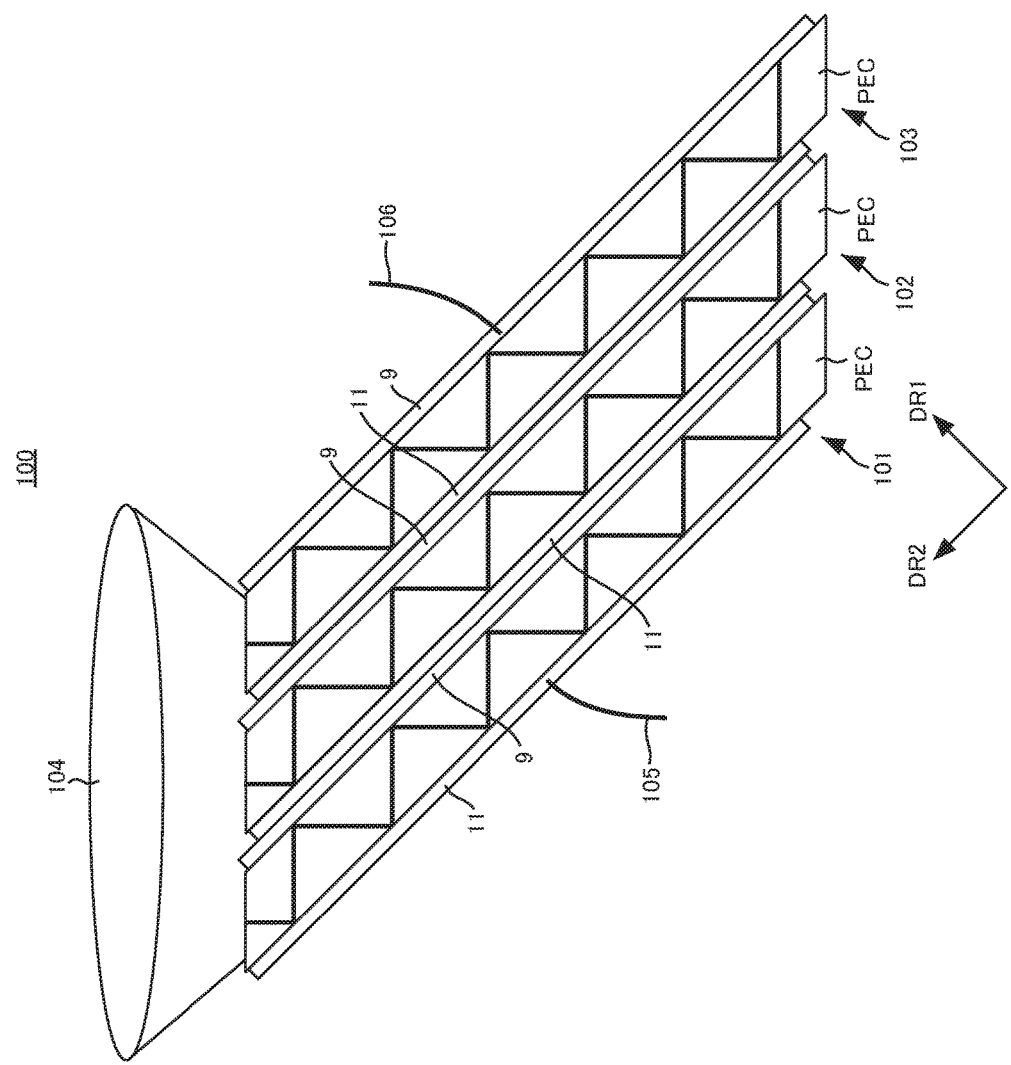
FIG. 8 is a schematic view illustrating the structure of a photoelectric conversion device according to a fourth embodiment.

FIG. 8 is a schematic view illustrating the structure of a photoelectric conversion device according to a fourth embodiment. Referring to FIG. 8, a photoelectric conversion device 100 in the fourth embodiment includes photoelectric conversion elements 101 to 103, a concentrator 104, and wires 105 and 106.

The photoelectric conversion elements 101 to 103 each include a p-type electrode 9 and an n-type electrode 11 on corresponding surfaces of the photoelectric conversion member PEC. In other words, the photoelectric conversion elements 101 to 103 each have the same structure as the structure of the photoelectric conversion element 10 but without the concentrator 12.

The photoelectric conversion element 102 is disposed such that its n-type electrode 11 contacts the p-type electrode 9 of the photoelectric conversion element 101. The photoelectric conversion element 103 is disposed such that its n-type electrode 11 contacts the p-type electrode 9 of the photoelectric conversion element 102.

The concentrator 104 is disposed adjacent to the photoelectric conversion elements 101 to 103. The concentrator 104 concentrates sunlight and causes the concentrated sunlight to enter the edges of incidence of the photoelectric conversion elements 101 to 103.

The wire 105 is connected to the n-type electrode 11 of the photoelectric conversion element 101. The wire 106 is connected to the p-type electrode 9 of the photoelectric conversion element 103.

The photoelectric conversion device 100 thus includes three photoelectric conversion elements 101 to 103 electrically coupled in series.

The photoelectric conversion device 100 is fabricated by preparing three photoelectric conversion elements 101 to 103 according to step (a) to step (j) in FIG. 2A to FIG. 4C, and then arranging these three photoelectric conversion elements 101 to 103 such that these three photoelectric conversion elements 101 to 103 are electrically coupled in series, and disposing the concentrator 104 adjacent to these three photoelectric conversion elements 101 to 103.

In the photoelectric conversion device 100, the concentrator 104 concentrates sunlight such that the entire edges of incidence of these three photoelectric conversion elements 101 to 103 are irradiated with light. The concentration ratio of the concentrator can be thus lower than that in the photoelectric conversion element 10. As a result, the concentrator can be downsized and reduced in cost.

In the photoelectric conversion device 100, the photoelectric conversion elements 101 to 103 may each have the structure of the photoelectric conversion element 10A or the photoelectric conversion element 10B but without the concentrator 12. This structure can improve the photoelectric conversion efficiency of each of the photoelectric conversion elements 101 to 103 and thus can improve the photoelectric conversion efficiency of the photoelectric conversion device 100.

The photoelectric conversion device 100 may include four or more photoelectric conversion elements electrically coupled in series. The photoelectric conversion device 100 normally includes plural photoelectric conversion elements electrically coupled in series.

Other description of the fourth embodiment is the same as the description of the first to third embodiments.

Fifth Embodiment

Figure 9:
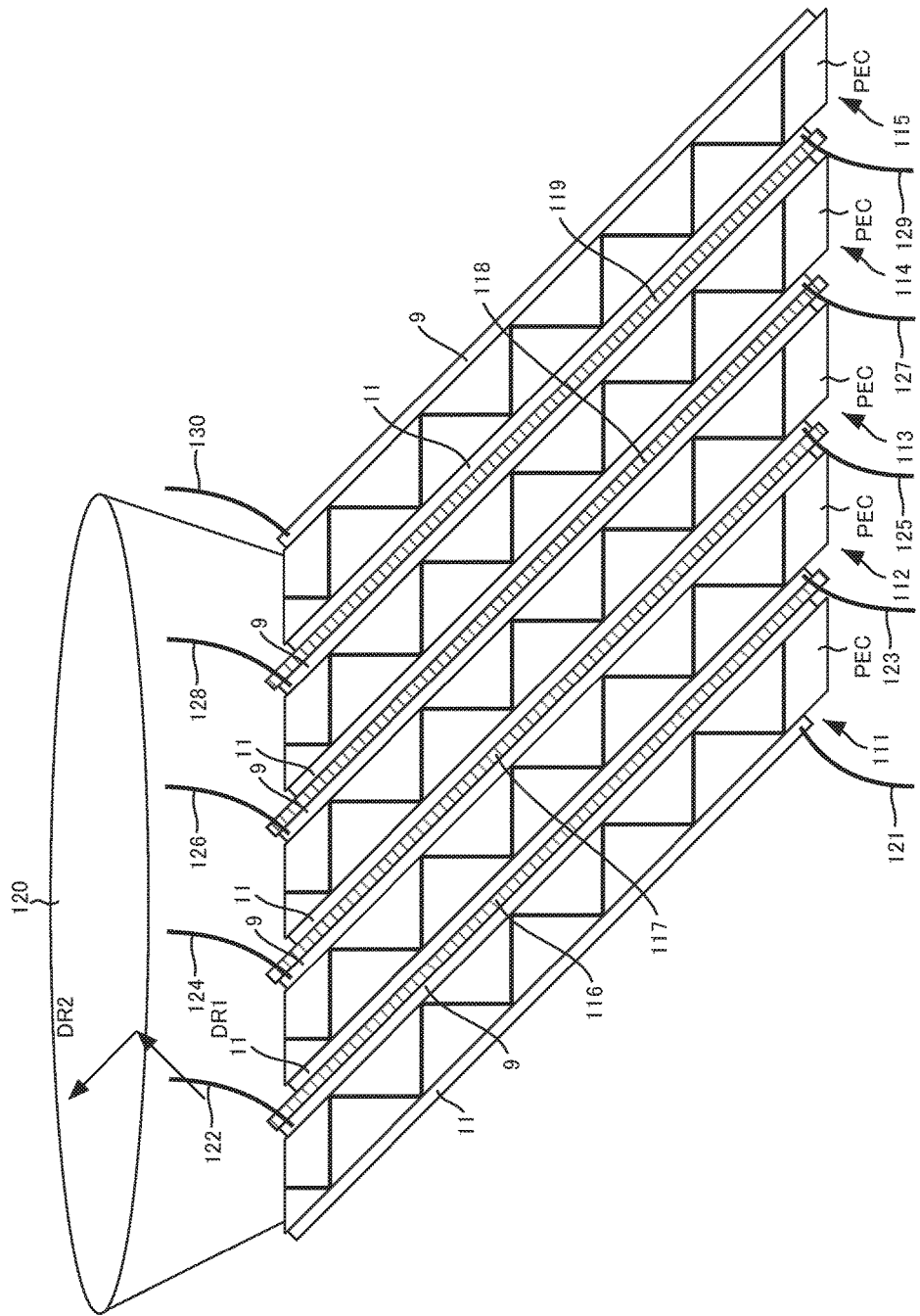
FIG. 9 is a schematic view illustrating the structure of a photoelectric conversion device according to a fifth embodiment.

FIG. 9 is a schematic view illustrating the structure of a photoelectric conversion device according to a fifth embodiment. Referring to FIG. 9, a photoelectric conversion device 100A in the fifth embodiment includes photoelectric conversion elements 111 to 115, insulating members 116 to 119, a concentrator 120, and wires 121 to 130.

The photoelectric conversion elements 111 to 115 each include a p-type electrode 9 and an n-type electrode 11 on corresponding surfaces of the photoelectric conversion member PEC. In other words, the photoelectric conversion elements 111 to 115 each have the structure of the photoelectric conversion element 10 but without the concentrator 12.

The photoelectric conversion element 111 is disposed such that its p-type electrode 9 contacts one surface of the insulating member 116. The photoelectric conversion element 112 is disposed such that its n-type electrode 11 contacts the other surface of the insulating member 116 and its p-type electrode 9 contacts one surface of the insulating member 117.

The photoelectric conversion element 113 is disposed such that its n-type electrode 11 contacts the other surface of the insulating member 117 and its p-type electrode 9 contacts one surface of the insulating member 118.

The photoelectric conversion element 114 is disposed such that its n-type electrode 11 contacts the other surface of the insulating member 118 and its p-type electrode 9 contacts one surface of the insulating member 119.

The photoelectric conversion element 115 is disposed such that its n-type electrode 11 contacts the other surface of the insulating member 119.

The insulating member 116 is disposed between the p-type electrode 9 of the photoelectric conversion element 111 and the n-type electrode 11 of the photoelectric conversion element 112 so as to contact the p-type electrode 9 of the photoelectric conversion element 111 and the n-type electrode 11 of the photoelectric conversion element 112.

The insulating member 117 is disposed between the p-type electrode 9 of the photoelectric conversion element 112 and the n-type electrode 11 of the photoelectric conversion element 113 so as to contact the p-type electrode 9 of the photoelectric conversion element 112 and the n-type electrode 11 of the photoelectric conversion element 113.

The insulating member 118 is disposed between the p-type electrode 9 of the photoelectric conversion element 113 and the n-type electrode 11 of the photoelectric conversion element 114 so as to contact the p-type electrode 9 of the photoelectric conversion element 113 and the n-type electrode 11 of the photoelectric conversion element 114.

The insulating member 119 is disposed between the p-type electrode 9 of the photoelectric conversion element 114 and the n-type electrode 11 of the photoelectric conversion element 115 so as to contact the p-type electrode 9 of the photoelectric conversion element 114 and the n-type electrode 11 of the photoelectric conversion element 115.

The concentrator 120 is disposed adjacent to the photoelectric conversion elements 111 to 115. The concentrator 120 concentrates sunlight and causes the concentrated sunlight to enter the edges of incidence of the photoelectric conversion elements 111 to 115.

The wires 121 and 122 are connected to the n-type electrode 11 and the p-type electrode 9 of the photoelectric conversion element 111, respectively.

The wires 123 and 124 are connected to the n-type electrode 11 and the p-type electrode 9 of the photoelectric conversion element 112, respectively.

The wires 125 and 126 are connected to the n-type electrode 11 and the p-type electrode 9 of the photoelectric conversion element 113, respectively.

The wires 127 and 128 are connected to the n-type electrode 11 and the p-type electrode 9 of the photoelectric conversion element 114, respectively.

The wires 129 and 130 are connected to the n-type electrode 11 and the p-type electrode 9 of the photoelectric conversion element 115, respectively.

The insulating members 116 to 119 are each formed of, for example, a polyimide film and have a thickness of, for example, 5 to 500 μm. As long as the insulating members 116 to 119 are each disposed between and in contact with the photoelectric conversion elements, the insulating members 116 to 119 may be in contact with only part of the surfaces of the photoelectric conversion elements.

The photoelectric conversion device 100A thus includes the photoelectric conversion elements 111 to 115 electrically coupled in parallel.

The photoelectric conversion device 100A is fabricated by preparing five photoelectric conversion elements 111 to 115 according to step (a) to step (j) in FIG. 2A to FIG. 4C, and then arranging these five photoelectric conversion elements 111 to 115 and the insulating members 116 to 119 such that these five photoelectric conversion elements 111 to 115 are electrically coupled in parallel, and disposing the concentrator 120 adjacent to these five photoelectric conversion elements 111 to 115.

In the photoelectric conversion device 100A, the concentrator 120 concentrates sunlight such that the entire edges of incidence of these five photoelectric conversion elements 111 to 115 are irradiated with light. The concentration ratio of the concentrator can be thus lower than that in the photoelectric conversion element 10. As a result, the concentrator can be downsized and reduced in cost.

In the photoelectric conversion device 100A, the photoelectric conversion elements 111 to 115 are electrically coupled in parallel. Thus, the photocurrent generated in each of the photoelectric conversion elements 111 to 115 can be extracted while the extracted current is not limited by the lowest photocurrent.

In the photoelectric conversion device 100A, the photoelectric conversion elements 111 to 115 may each have the structure of the photoelectric conversion element 10A or the photoelectric conversion element 10B but without the concentrator 12. This structure can improve the photoelectric conversion efficiency of each of the photoelectric conversion elements 111 to 115 and thus can improve the photoelectric conversion efficiency of the photoelectric conversion device 100A.

The photoelectric conversion device 100A may include six or more photoelectric conversion elements electrically coupled in parallel. The photoelectric conversion device 100A normally includes plural photoelectric conversion elements electrically coupled in parallel.

Other description of the fifth embodiment is the same as the description of the first to third embodiments.

Sixth Embodiment

Figure 10:
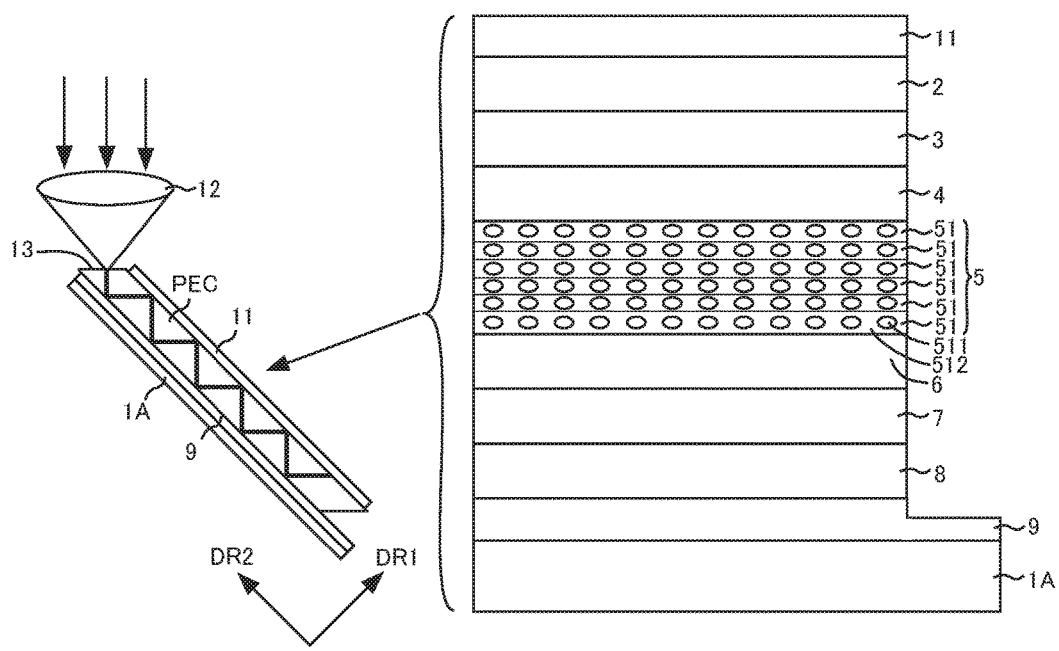
FIG. 10 is a schematic view illustrating the structure of a photoelectric conversion element according to a sixth embodiment.

FIG. 10 is a schematic view illustrating the structure of a photoelectric conversion element according to a sixth embodiment. Referring to FIG. 10, in a photoelectric conversion element 10C according to the sixth embodiment, the substrate 1 of the photoelectric conversion element 10 illustrated in FIG. 1 is replaced by a flexible substrate 1A. In the photoelectric conversion element 10C, a p-type electrode 9, a contact layer 8, a window layer 7, an emitter layer 6, a photoelectric conversion layer 5, a base layer 4, a BSF layer 3, a buffer layer 2, and an n-type electrode 11 are sequentially disposed on one surface of the flexible substrate 1A.

The photoelectric conversion member PEC illustrated in FIG. 10 includes the flexible substrate 1A, the p-type electrode 9, the contact layer 8, the window layer 7, the emitter layer 6, the photoelectric conversion layer 5, the base layer 4, the BSF layer 3, the buffer layer 2, and the n-type electrode 11.

The flexible substrate 1A is formed of, for example, a polyimide film and has a thickness of, for example, 5 to 500 μm.

FIGS. 11A to 11D and 12A to 12B are views illustrating first and second processes of a method for fabricating the photoelectric conversion element 10C shown in FIG. 10.

Referring to FIGS. 11A to 11D, step (a) to step (h) illustrated in FIGS. 2A to 2E and FIG. 3A to 3C are sequentially performed (see step (a) in FIG. 11A) when the fabrication of the photoelectric conversion element 10C is started.

Subsequently, the p-type electrode 9 is formed on the contact layer 8 by vapor deposition using resistance heating (see step (b) in FIG. 11B).

The p-type electrode 9 is then formed on one surface of the flexible substrate 1A by vapor deposition using resistance heating (see step (c) in FIG. 11C).

Thereafter, the p-type electrode 9 formed on the contact layer 8 and the p-type electrode 9 formed on the flexible substrate 1A are wafer-connected (see step (d) in FIG. 11D).

Figure 12A:
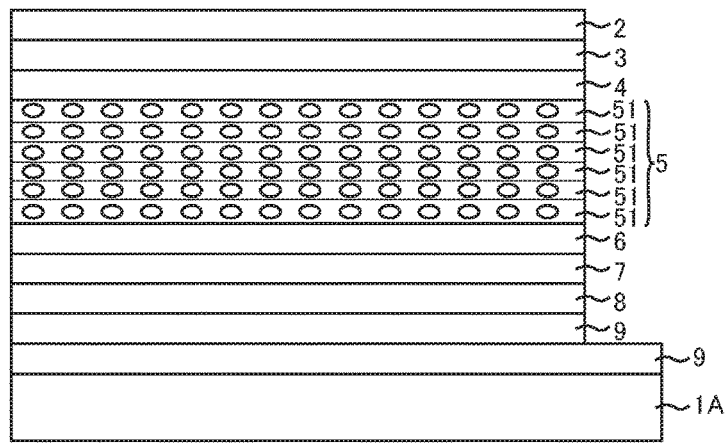
FIGS. 12A to 12B are views illustrating a second process of the method for fabricating the photoelectric conversion element shown in FIG. 10.
Figure 12B:
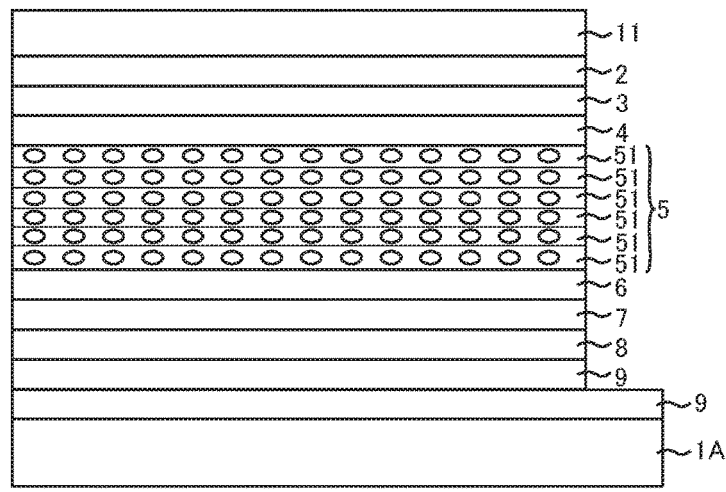

Referring to FIGS. 12A and 12B, the substrate 1 is selectively etched (step (e) in FIG. 12A) after step (d) illustrated in FIG. 11D.

The n-type electrodes 11 is then formed on the buffer layer 2 by vapor deposition using resistance heating (see step (f) in FIG. 12B).

The photoelectric conversion element 10C is obtained accordingly.

A photoelectric conversion element with high flexibility can be obtained by fabricating a photoelectric conversion element using the flexible substrate 1A. This structure allows the substrate 1 for epitaxial growth to be recycled and thus leads to cost reduction.

The substrate subjected to transfer is not limited to a flexible substrate. The substrate may be, for example, a metal foil and is normally a conductive substrate.

The photoelectric conversion element according to the sixth embodiment may be a photoelectric conversion element that has undergoes the same modification as that made in changing from the photoelectric conversion element 10 to the photoelectric conversion element 10A or the photoelectric conversion element 10B. This structure can further improve the photoelectric conversion efficiency of the photoelectric conversion element including, for example, the flexible substrate 1A different from a crystal substrate.

Other description of the sixth embodiment is the same as the description of the first to third embodiments.

Seventh Embodiment

Figure 13:
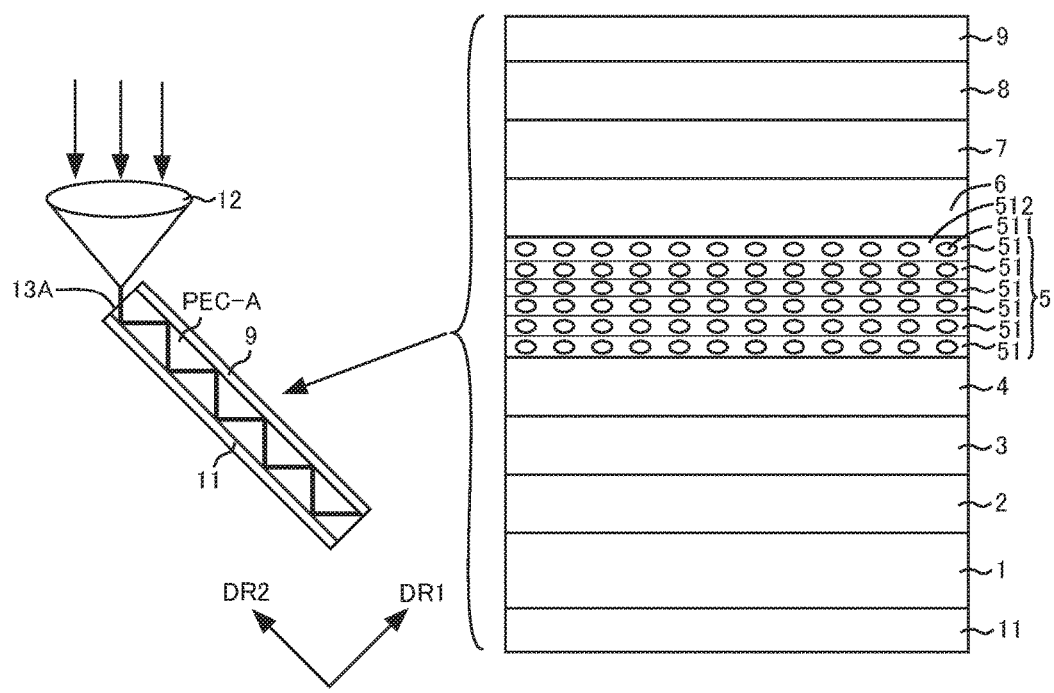
FIG. 13 is a schematic view illustrating the structure of a photoelectric conversion element according to a seventh embodiment.

FIG. 13 is a schematic view illustrating the structure of a photoelectric conversion element according to a seventh embodiment. Referring to FIG. 13, a photoelectric conversion element 10D in the seventh embodiment includes a photoelectric conversion member PEC-A instead of the photoelectric conversion member PEC of the photoelectric conversion element 10 illustrated in FIG. 1 but otherwise has the same structure as the photoelectric conversion element 10.

The photoelectric conversion member PEC-A has an edge 13A of incidence instead of the edge 13 of incidence of the photoelectric conversion member PEC but otherwise has the same structure as the photoelectric conversion member PEC.

The edge 13A of incidence is an edge having the same direction as the growth direction DR1 of the quantum dots 511.

An edge opposite to the edge 13A of incidence in the in-plane direction DR2 is also an edge having the same direction as the growth direction DR1 of the quantum dots 511.

In the photoelectric conversion element 10D, the edges of the photoelectric conversion member PEC-A in the in-plane direction DR2 are not polished and do not have a certain angle relative to the growth direction DR1 of the quantum dots 511.

In the photoelectric conversion element 10D, a concentrator 12 is disposed such that concentrated sunlight enters the photoelectric conversion member PEC-A in an oblique direction relative to the growth direction DR1 of the quantum dots 511 (in the direction having an angle larger than 0 degrees and smaller than 90 degrees relative to the growth direction DR1).

The photoelectric conversion element 10D is fabricated according to the process views of step (a) to step (k) illustrated in FIG. 2A to FIG. 4C and excluding step (j).

In the photoelectric conversion element 10D, the concentrated sunlight enters the photoelectric conversion member PEC-A in an oblique direction relative to the growth direction DR1 of the quantum dots 511, which improves photoelectric conversion efficiency as for the photoelectric conversion element 10.

The photoelectric conversion element according to the seventh embodiment may be a photoelectric conversion element obtained by subjecting the photoelectric conversion element 10D to the same modification as that made in changing from the photoelectric conversion element 10 to any one of the photoelectric conversion elements 10A, 10B, and 10C. This provides advantageous effects similar to those obtained by the photoelectric conversion elements 10A, 10B, and 10C.

The photoelectric conversion devices 100 and 100A may be fabricated using the photoelectric conversion element 10D.

Other description of the seventh embodiment is the same as the description of the first to sixth embodiments.

Eighth Embodiment

There is known a quantum-type infrared sensor which detects infrared rays by exciting carriers with the photon energy of infrared rays.

In the eighth embodiment, the photoelectric conversion elements 10, 10A, 10B, 10C, and 10D according to the first to third, sixth, and seventh embodiments can be used for the quantum-type infrared sensor.

In the first to third, sixth, and seventh embodiments, the photoelectric conversion element has a pin structure but may have an nin structure. In this case, the photoelectric conversion layer 5 having plural quantum layers is sandwiched between n-type contact layers from above and below to provide an nin structure, which is processed into a mesa structure by micromachining. Then, top and bottom electrodes are formed in the photoelectric conversion element, and photodetection can be carried out by applying a bias voltage.

In a quantum-type infrared sensor, carriers may be extracted at high efficiency by improving infrared absorption in order to obtain a highly sensitive infrared sensor.

As described above, the photoelectric conversion elements according to the first to third, sixth, and seventh embodiments provide high infrared absorption and allow generated carriers to be extracted at high efficiency. The structure as described above realizes high sensitivity.

The first to seventh embodiments describe examples in which the photoelectric conversion element is used in solar cells. However, besides solar cells, the photoelectric conversion element can be used in, for example, photodiodes, semiconductor optical amplifiers which amplify optical signals by stimulated emission of carriers stored in semiconductors, and quantum-dot infrared sensors which detect infrared rays by exciting carriers with the photon energy of infrared rays.

In the first to eighth embodiments described above, the base layer 4 is an n-type semiconductor layer, and the emitter layer 6 is a p-type semiconductor layer. However, the base layer 4 may be a p-type semiconductor layer, and the emitter layer 6 may be an n-type semiconductor layer.

The first to third and sixth embodiments describe the photoelectric conversion elements 10, 10A, 10B, and 10C in which the edge of the photoelectric conversion member PEC in the in-plane direction DR2 is polished so as to have a certain angle relative to the growth direction DR1 of the quantum dots 511. The seventh embodiment describes the photoelectric conversion element 10D in which sunlight enters the photoelectric conversion member PEC-A in an oblique direction relative to the growth direction DR1 of the quantum dots 511 without polishing the edges of the photoelectric conversion member PEC-A in the in-plane direction DR2.

Therefore, the photoelectric conversion elements according to the embodiments of the present disclosure each have a structure in which sunlight enters the photoelectric conversion layers 5 in an oblique direction relative to the growth direction DR1 of the quantum dots 511.

In the first to eighth embodiments, the photoelectric conversion elements and the photoelectric conversion devices according to the embodiments of the present disclosure have the following structures.

Structure 1

A photoelectric conversion element includes a substrate, a photoelectric conversion layer, a concentrator, a first electrode, and a second electrode. The photoelectric conversion layer is disposed on the substrate and has at least one quantum layer. The first electrode is disposed at one side of the photoelectric conversion layer in the thickness direction. The second electrode is disposed at the other side of the photoelectric conversion layer in the thickness direction. The photoelectric conversion layer has an edge of incidence at one end of the photoelectric conversion layer in the direction perpendicular to the thickness direction of the photoelectric conversion layer. The edge of incidence guides light from the concentrator to the photoelectric conversion layer in an oblique direction relative to the thickness direction of the photoelectric conversion layer.

In the photoelectric conversion element according to the embodiment of the present disclosure, incident light is reflected plural times inside the photoelectric conversion layer, which increases the effective thickness of an absorption layer and thus improves the absorption associated with the intersublevel transition (intersubband transition) in the quantum structure. This enables effective absorption of light polarized in the growth direction of the quantum layer and thus results in a large improvement in photoelectric conversion efficiency. In other words, the photoelectric conversion element in which the photoelectric conversion layer has a quantum layer has advantageous effects.

Since the electrodes are disposed in the growth direction of the quantum layer, photogenerated carriers can easily travel to the electrodes. When the length of the photoelectric conversion element in the direction of light propagation is increased and the thickness of the photoelectric conversion layer is decreased (the number of quantum layers is reduced), an effective traveling distance for carriers can be shortened and the extracted electric current can be increased. This can improve photoelectric conversion efficiency.

Structure 2

The photoelectric conversion element in Structure 1 further includes a first metal layer. The first metal layer is disposed on an edge opposite to the edge of incidence in the direction perpendicular to the thickness direction of the photoelectric conversion layer.

The first metal layer disposed on the edge opposite to the edge of incidence reduces the light transmission loss on the edge opposite to the edge of incidence. As a result, light passes through the photoelectric conversion layer a greater number of times, and thus the length of the photoelectric conversion element in the direction of light propagation can be shortened.

Therefore, the photoelectric conversion efficiency can be further improved, and the photoelectric conversion element can be downsized and reduced in cost.

Structure 3

The photoelectric conversion element in Structure 1 or Structure 2 further includes an antireflection film. The antireflection film is disposed on the edge of incidence.

The antireflection film disposed on the edge of incidence reduces the light reflection loss on the edge of incidence.

Therefore, the photoelectric conversion efficiency can be further improved, and the photoelectric conversion element can be downsized and reduced in cost.

Structure 4

The photoelectric conversion element in Structure 1 or Structure 2 further includes an antireflection film and a second metal layer. The antireflection film is disposed on the edge of incidence. The second metal layer is disposed on the edge of incidence.

The antireflection film and the second metal layer disposed on the edge of incidence reduce the light reflection loss on the edge of incidence and reduce the light transmission loss on the edge of incidence.

Therefore, the photoelectric conversion efficiency can be further improved, and the photoelectric conversion element can be downsized and reduced in cost.

Structure 5

The quantum layer in any one of Structure 1 to Structure 4 includes a quantum dot.

The quantum dots having small in-plane occupancy can more effectively improve the absorption associated with the intersublevel transition (intersubband transition).

Therefore, the photoelectric conversion efficiency can be improved.

Structure 6

The quantum layer in any one of Structure 1 to Structure 5 is doped with an impurity.

Doping the quantum layer with an impurity enables effective occurrence of the intersubband transition.

Structure 7

The quantum layer in any one of Structure 1 to Structure 6 may contain at least one of Al and P.

The photoelectric conversion efficiency can be improved more effectively in the quantum layer that contains at least one of Al and P and tends to have low absorption in the intersublevel absorption (intersubband absorption). Structure 8

The photoelectric conversion device includes plural photoelectric conversion elements. The photoelectric conversion elements are electrically coupled in series or in parallel. Each of the photoelectric conversion elements corresponds to the photoelectric conversion element according to any one of Structure 1 to Structure 7.

In the photoelectric conversion device, the concentrator can concentrate light into the photoelectric conversion element at low concentration ratio.

Therefore, the concentrator can be downsized and reduced in cost.

The embodiments disclosed herein are for illustrative purposes in any respect and should not be construed as restrictive. The scope of the present disclosure is provided by the scope of the claims rather than the description of the embodiments and is intended to include any modification within the scope and meaning equivalent to the claims.

The present disclosure is applied to a photoelectric conversion element and a photoelectric conversion device including the photoelectric conversion element.

The present disclosure contains subject matter related to that disclosed in Japanese Priority Patent Application JP 2016-126295 filed in the Japan Patent Office on Jun. 27, 2016, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A photoelectric conversion element comprising:
   a substrate;
   a photoelectric conversion layer disposed on the substrate and having at least one quantum layer;
   a concentrator;
   a first electrode disposed at one side of the photoelectric conversion layer in a thickness direction; and
   a second electrode disposed at the other side of the photoelectric conversion layer in the thickness direction, wherein
   the photoelectric conversion layer has an edge of incidence at one end of the photoelectric conversion layer in a direction perpendicular to the thickness direction of the photoelectric conversion layer, the edge of incidence guiding light from the concentrator to the photoelectric conversion layer in an oblique direction relative to the thickness direction of the photoelectric conversion layer;
   the quantum layer includes a quantum dot; and
   the edge of incidence is disposed in an oblique direction relative to the thickness direction of the photoelectric conversion layer.

2. The photoelectric conversion element according to claim 1, further comprising a first metal layer disposed on an edge opposite to the edge of incidence in the direction perpendicular to the thickness direction of the photoelectric conversion layer.

3. The photoelectric conversion element according to claim 1, further comprising an antireflection film disposed on the edge of incidence.

4. The photoelectric conversion element according to claim 1, further comprising:
   an antireflection film disposed on the edge of incidence; and
   a second metal layer disposed on the edge of incidence.

5. The photoelectric conversion element according to claim 1, wherein the quantum layer is doped with an impurity.

6. The photoelectric conversion element according to claim 1, wherein the quantum layer contains at least one of Al and P.

7. A photoelectric conversion device comprising a plurality of photoelectric conversion elements electrically coupled in series or in parallel,
   wherein each of the plurality of photoelectric conversion elements corresponds to the photoelectric conversion element according to claim 1.

* * * * *